United States Patent
Kozuka

(10) Patent No.: US 12,408,266 B2
(45) Date of Patent: Sep. 2, 2025

(54) CIRCUIT BOARD

(71) Applicant: CANON KABUSHIKI KAISHA, Tokyo (JP)

(72) Inventor: Yasuhiro Kozuka, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 148 days.

(21) Appl. No.: 18/460,327

(22) Filed: Sep. 1, 2023

(65) Prior Publication Data

US 2024/0080972 A1   Mar. 7, 2024

(30) Foreign Application Priority Data

Sep. 2, 2022   (JP) ................. 2022-139633

(51) Int. Cl.
| | |
|---|---|
| H05K 1/02 | (2006.01) |
| H01L 23/538 | (2006.01) |
| H01L 25/16 | (2023.01) |
| H02M 3/155 | (2006.01) |

(52) U.S. Cl.
CPC ....... *H05K 1/0295* (2013.01); *H01L 23/5386* (2013.01); *H01L 25/16* (2013.01); *H02M 3/155* (2013.01); *H05K 2201/10022* (2013.01); *H05K 2201/10166* (2013.01); *H05K 2201/10545* (2013.01)

(58) Field of Classification Search
CPC .......... H05K 1/02; H05K 1/0295; H05K 2201/0022; H01L 23/5386; H01L 25/16; H02M 3/155
USPC ........................................... 361/783
See application file for complete search history.

(56) References Cited

FOREIGN PATENT DOCUMENTS

JP   2021164356 A   10/2021

*Primary Examiner* — Tremesha W Burns
(74) *Attorney, Agent, or Firm* — Canon U.S.A., Inc. IP Division

(57) ABSTRACT

A circuit board on which a first set or a second set is exclusively mounted includes an IC attachment part, first and second attachment parts, and first, second, and third conductor patterns. The first set includes a first integrated circuit and a first electric element, and the second set including a second integrated circuit and a second electric element. The first attachment part includes first and second pads, and the second attachment part includes third and fourth pads. In a case where the first electric element is not mounted, the first pad and the second pad of the first attachment part are opened so as not to be electrically conductive with each other. In a case where the second electric element is not mounted, the third pad of the second attachment part and the second pad are opened so as not to be electrically conductive with each other.

10 Claims, 9 Drawing Sheets

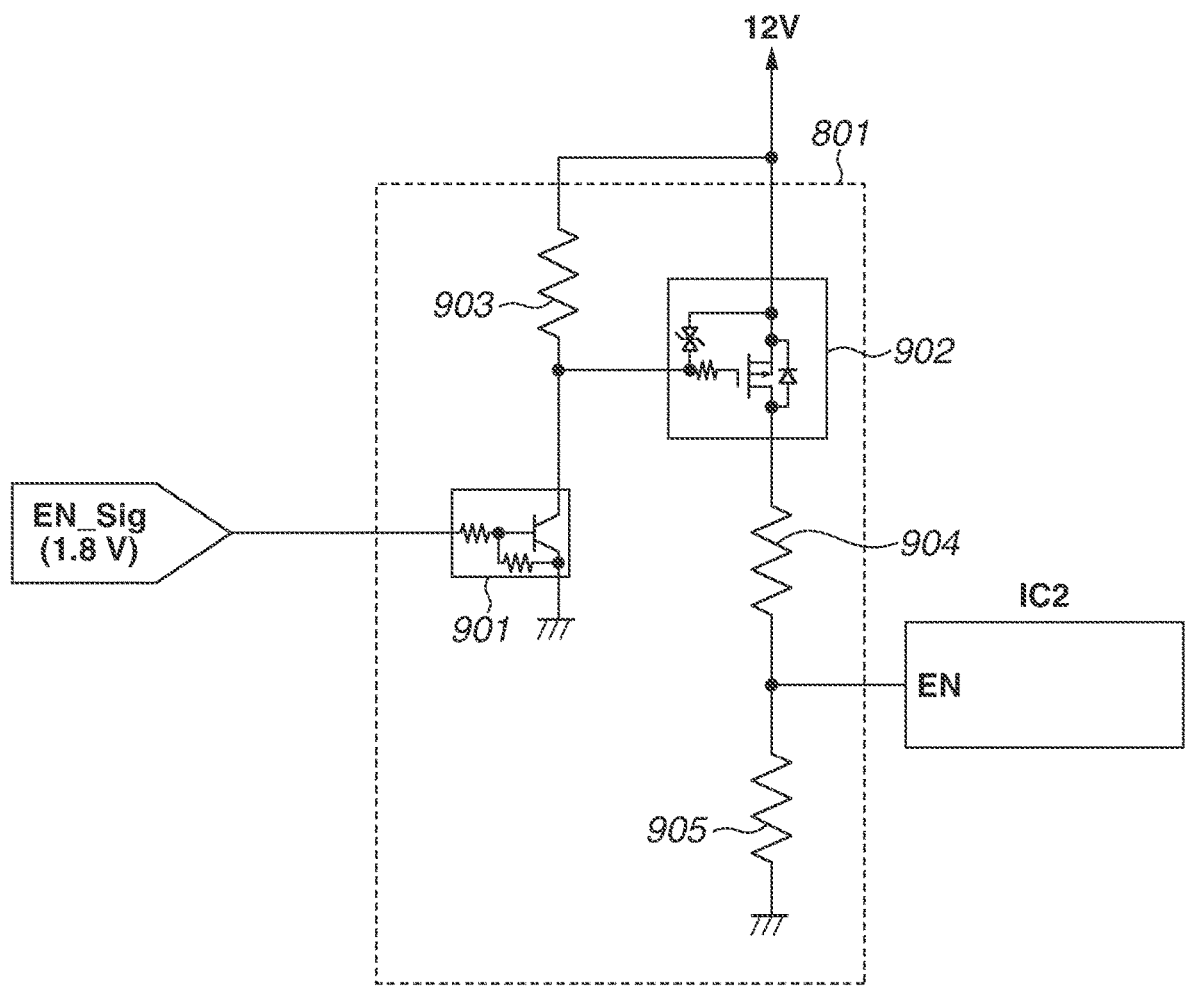

CIRCUIT BOARD

BACKGROUND

Field

The present disclosure relates to a circuit board on which different integrated circuits are exclusively mountable.

Description of the Related Art

Some electric appliances include a plurality of circuit boards for control. A plurality of electric elements are mounted on the circuit board for control, such as an electric element for arithmetic calculation, an electric element for drive control, and an electric element for generating a power source voltage. Each of the electric elements forms an electric element component that includes surrounding electric elements to implement a predetermined function. For example, an electric element component is formed of an integrated circuit (IC) and surrounding electric elements such as resistors connected to input and output terminals of the IC, capacitors, and inductors.

The circuit boards are manufactured by procuring and mounting a large number of electric elements. However, electric elements may be difficult to procure for various reasons. For example, there has been recently an issue of a short supply of ICs. In order to avoid such a situation, replacement parts that are identical in function to original electric elements and are identical or similar in shapes and specifications to the original electric elements are searched for in advance and such replacement parts are procured when there arises an issue in procurement of the original electric elements. The replacement parts are used to continue the manufacture of the circuit boards.

In a circuit board for control, the value of a necessary voltage may vary depending on a connected actuator. Thus, a plurality of electric element components for voltage generation is mounted on the circuit board to generate voltages of different values. In this configuration, a plurality of power source voltages of different voltage values is generated in the circuit board for control. Japanese Patent Application Laid-Open No. 2021-164356 discusses an IC of a direct current (DC)-DC converter with small heat loss, as an electric element component for voltage generation.

SUMMARY

According to an aspect of the present disclosure, a circuit board on which a first set or a second set is exclusively mounted, wherein the first set includes at least a first integrated circuit and a first electric element, and the second set including at least a second integrated circuit and a second electric element, includes an integrated circuit (IC) attachment part to which the first integrated circuit or the second integrated circuit is attached, a first attachment part to which the first electric element is attachable and that includes at least a first pad and a second pad, a second attachment part to which the second electric element is attachable and that includes at least a third pad and a fourth pad, a first conductor pattern configured to electrically connect the IC attachment part and the first pad of the first attachment part, a second conductor pattern configured to electrically connect the IC attachment part and the third pad of the second attachment part, and a third conductor pattern configured to electrically connect the second pad of the first attachment part and the fourth pad of the second attachment part, wherein, in a case where the first electric element is not mounted, the first pad and the second pad of the first attachment part are opened so as not to be electrically conductive with each other, and wherein, in a case where the second electric element is not mounted, the third pad of the second attachment part and the second pad are opened so as not to be electrically conductive with each other.

Further features of the present disclosure will become apparent from the following description of exemplary embodiments with reference to the attached drawings.

BRIEF DESCRIPTION OF THE DRAWINGS

FIG. 5 is a circuit block diagram of a voltage conversion unit.

DESCRIPTION OF THE EMBODIMENTS

Some exemplary embodiments according to the present disclosure provide a circuit board on which an integrated circuit (IC) can be easily replaced with another IC.

For example, the ICs for a direct current (DC)-DC converter mostly vary in electric specifications. For this reason, even if an IC is replaced with another IC, there is a high possibility that normal operations cannot be ensured due to different electric specifications. Besides DC-DC converters, in a motor driver for driving a motor, there is a high possibility that, if an IC is replaced with another IC, normal operations cannot be ensured.

Mounted on a circuit board for implementing a predetermined function as described above are an IC and an electric element component that is formed of surrounding parts (electric elements) supplementing the function of the IC. In many cases, the wiring (conductor pattern) on the circuit board is specific to the IC. Thus, in a case where an IC is replaced with another IC, the surrounding parts and wiring (conductor pattern) corresponding to the replacement IC are required. That is, in order to replace an IC with another IC, the circuit board needs to be designed as such. This has caused an issue that the IC cannot be easily replaced.

According to some exemplary embodiments of the present disclosure, it is possible to easily replace an IC with another IC.

Hereinafter, a circuit board provided in an image formation apparatus 100 will be described as an example. However, the technique of the present disclosure is also similarly applicable to circuit boards that are provided in information devices such as personal computers (PCs) and servers and general electric appliances such as air conditioners and refrigerators.

Figure 1:
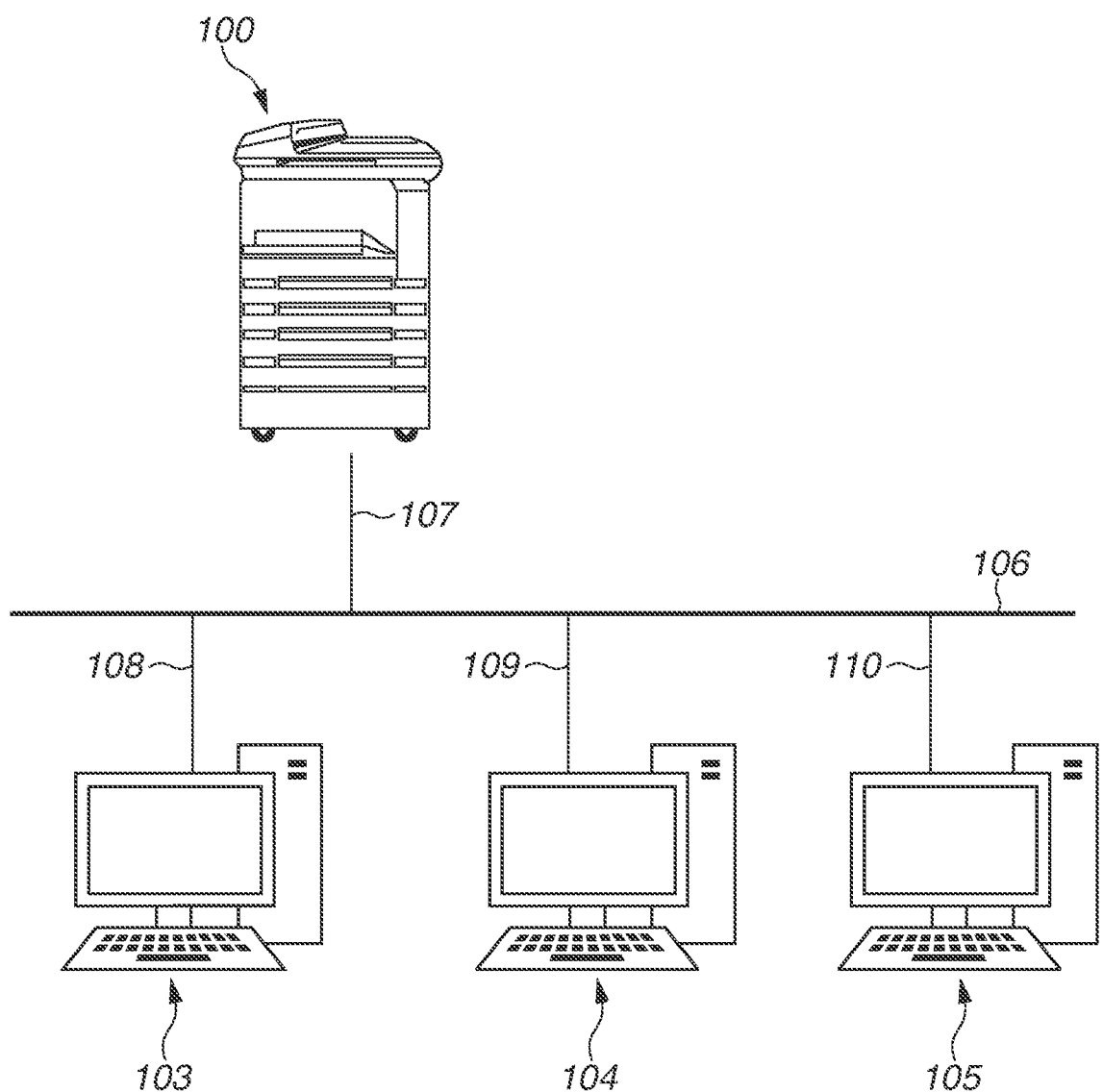
FIG. 1 is a schematic view of an image formation apparatus connected via a network.

FIG. 1 is a schematic view of the image formation apparatus 100 connected to a plurality of PCs via a network. The image formation apparatus 100 is connected to a local area network (LAN) 106 using a LAN cable 107. A plurality of image formation apparatuses can be connected to the same LAN 106. The PCs 103, 104, and 105 are connected to the LAN 106 using LAN cables 108, 109, and 110, respectively. FIG. 1 illustrates connection using LAN cables. However, the connection may be made using a wireless LAN. When the PC 103 sends a print job, the print job is transmitted to the image formation apparatus 100. In order to power off the image formation apparatus 100 from the PC 104, an instruction for remote shutdown is transmitted to the image formation apparatus 100 through the LAN 106.

Figure 2:
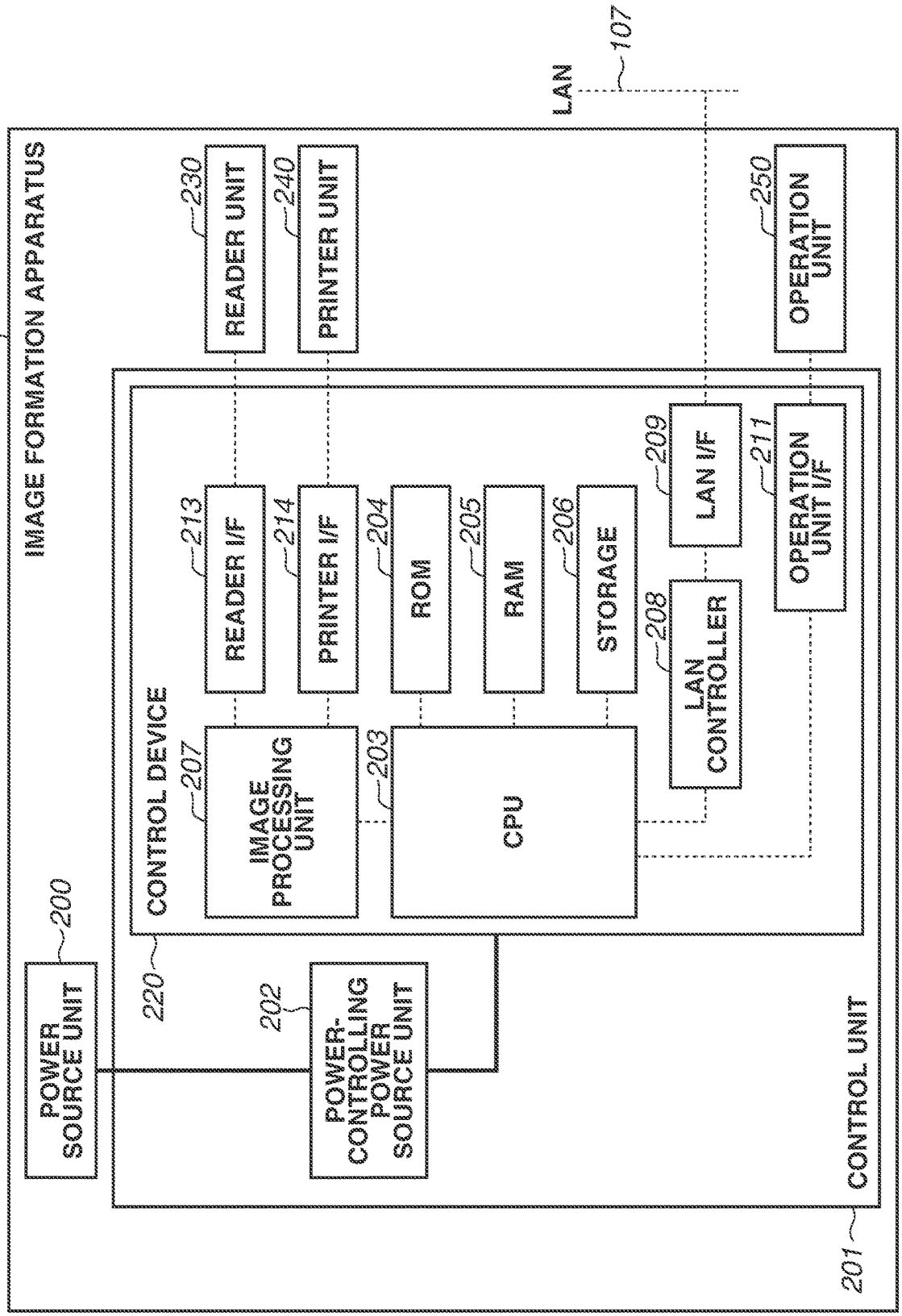
FIG. 2 is a system block diagram of the image formation apparatus.

FIG. 2 is a system block diagram of the image formation apparatus 100. In the image formation apparatus 100, a power source unit 200 supplies power to each block. A power-controlling power source unit 202 controls the power supply to the power source unit 200 and a control device 220 of the image formation apparatus 100. The power-controlling power source unit 202 is a block that is mounted in the control unit 201 to control whether to supply power to each block in response to an instruction issued by a user with a power switch (SW) or the like. The details will be described with reference to FIG. 3. The control device 220 includes a central processing unit (CPU) 203 to execute software programs for controlling the entire image formation apparatus 100. The CPU 203 is connected to a read only memory (ROM) 204, a random access memory (RAM) 205, and a storage 206. The storage 206 is a hard disk drive (HDD) or a solid state drive (SSD), for example. The ROM 204 stores an activation program of the image formation apparatus 100, various setting values, and others. The RAM 205 is used for temporary data storage and the like under the control of the image formation apparatus 100. The storage 206 is connected to the CPU 203 by serial Advanced Technology Attachment (hereinafter, called SATA). The CPU 203 may be connected to a plurality of storages. For example, the CPU 203 may perform control such as RAID0 (striping) or RAID1 (mirroring), but detailed description of the control will be omitted. The CPU 203 writes or reads data to and from the storage 206. The storage 206 stores some of software programs for saving temporary image data and operating the image formation apparatus 100.

The CPU 203 is connected to an image processing unit 207, and the image processing unit 207 is connected to a reader 230 and a printer 240. The image formation apparatus 100 may be controlled directly by the CPU 203 or may be controlled via the image processing unit 207. The image processing unit 207 performs image processing such as color space conversion on image data received from the reader 230 to convert into print data, and outputs the converted data to the printer 240. The reader 230 has an auto document feeder (ADF) and a scanner unit, reads an image on a document placed on a document glass or the ADF to generate image data, and transmits the image data to the image processing unit 207. The image data may be processed by a CPU (not illustrated) built in the reader 230 or may be processed by the image processing unit 207. The printer 240 prints the image data received from the image processing unit 207 on paper. A LAN controller (hereinafter, called LANC) is connected to the LAN 106 (network) using the LAN cable 107 and is used as input control of a print job from a PC or the like. An operation unit 250 is an interface (IF) that receives instructions from the user and receives instructions for copying, scanning, printing, shifting to the power-saving mode, or the like. The operation unit 250 is formed of a liquid crystal display (LCD) panel, a touch panel, or the like.

Figure 3:
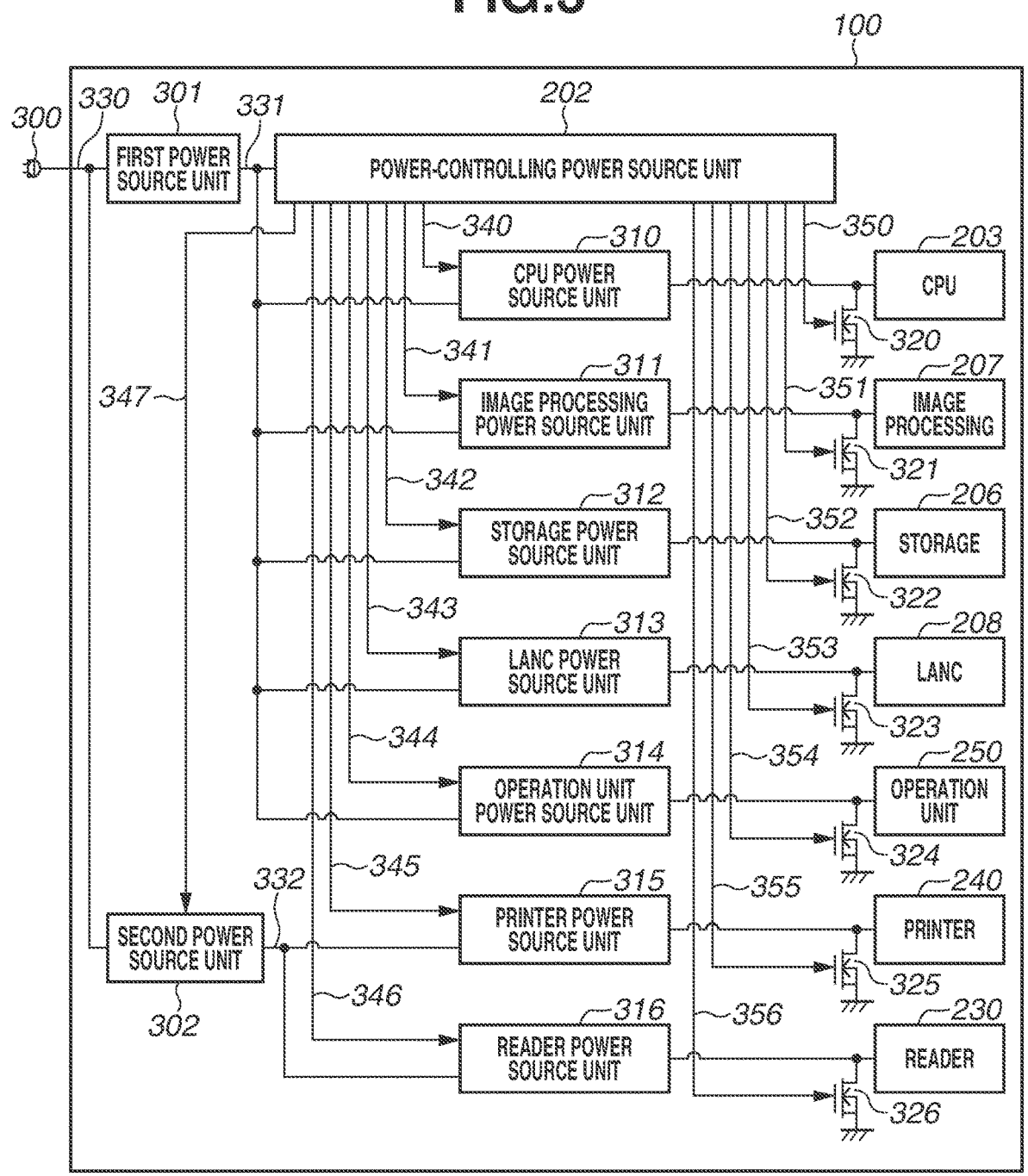
FIG. 3 is a functional block diagram related to power source control of the image formation apparatus.

FIG. 3 is a functional block diagram related to power source control of the image formation apparatus 100. A power source 330 is input by a power plug 300 and is supplied to a first power source unit 301 and a second power source unit 302 of the image formation apparatus 100. The first power source unit 301 serves as a power source 331 to supply power to the power-controlling power source unit 202 and the power source blocks, and the power-controlling power source unit 202 controls turn-on/off of the power source blocks. At this time, the first power source unit 301 converts a voltage in accordance with the power-controlling power source unit 202 and supplies the power source. The power source units to be mentioned in the following description do not serve as single power sources but convert a voltage in a manner suited to a supply destination and output the voltage in response to an instruction from the power source control unit. Detailed description of the output voltages and power source sequences of the power source will be omitted. The power-controlling power source unit 202 outputs power source control signals (340 to 344) to turn off and on the individual blocks. The first power source unit 301 supplies power from the power source blocks (310 to 314) to each block. In turning off the power sources, not only the power source blocks (340 to 344) are turned off but also signals (350 to 354) for controlling discharging circuits (320 to 324) are used to comply with the regulations for the individual blocks. Although as the discharging circuits, only transistors are simply illustrated in the drawing, the value of flowing current is adjusted using resistors to comply with the regulations for the individual blocks. In order to suppress power consumption, the second power source unit 302 serves as a power source 332 to supply power to blocks at a large power load such as the printer 240 and the reader 230 only when needed, under the control of the power-controlling power source unit 202. The second power source unit 302 supplies power from the power source blocks (315 and 316) to each block. In turning off the power sources, not only the power source blocks (345 and 346) are turned off but also signals (355 and 356) for discharging (325 and 326) are used to comply with the regulations for the individual blocks. As shown in FIG. 3, a large number of power source circuits are used in electronic devices. These power source circuits are used to generate a power source in accordance with the specifications of the used electronic devices and power on and off the electronic devices. Although the power source blocks area illustrated as independent blocks, the power source blocks may be shared with other power source blocks.

As the circuit board in the first exemplary embodiment, hereinafter, a circuit board in a DC-DC converter will be described. Integrated circuits identical in the number of terminal pins, terminal pin arrangement, and function and different in a threshold to be compared to the input voltage of an enable terminal are exclusively mountable on the circuit board.

Figure 4A:
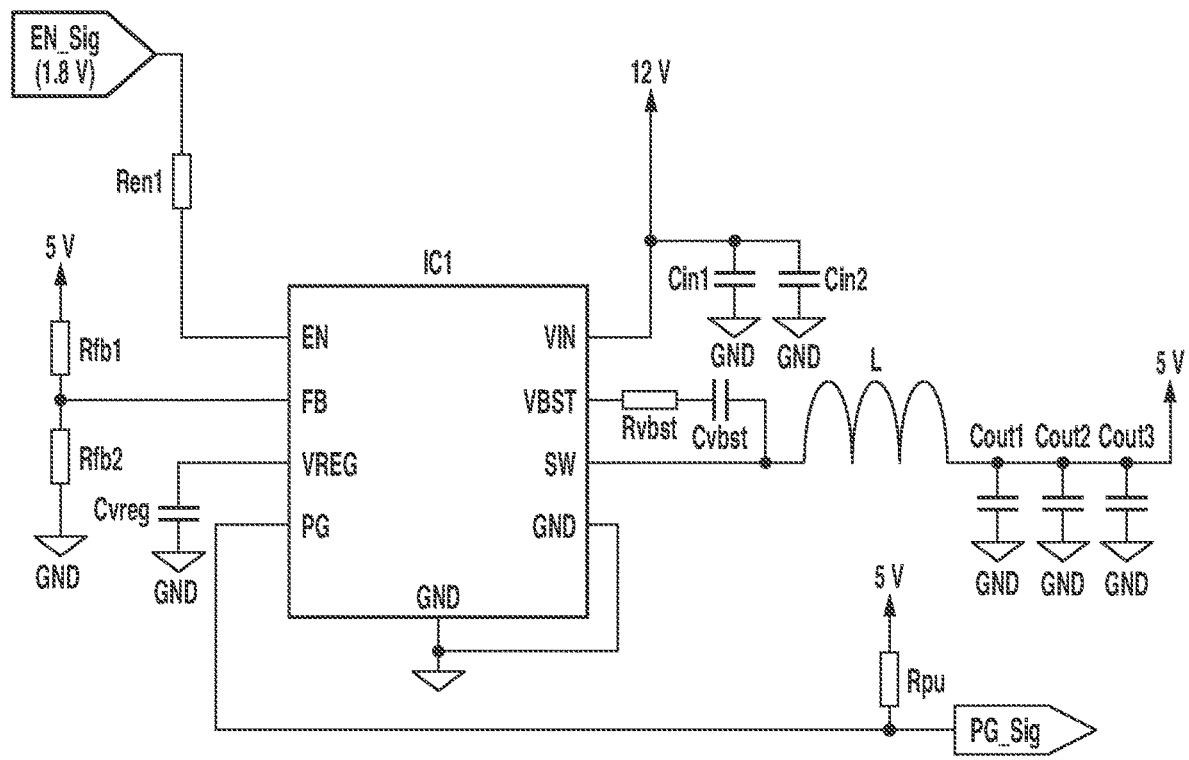
FIGS. 4A and 4B are circuit block diagrams of a direct current (DC)-DC converter in which an integrated circuit is mounted.
Figure 4B:
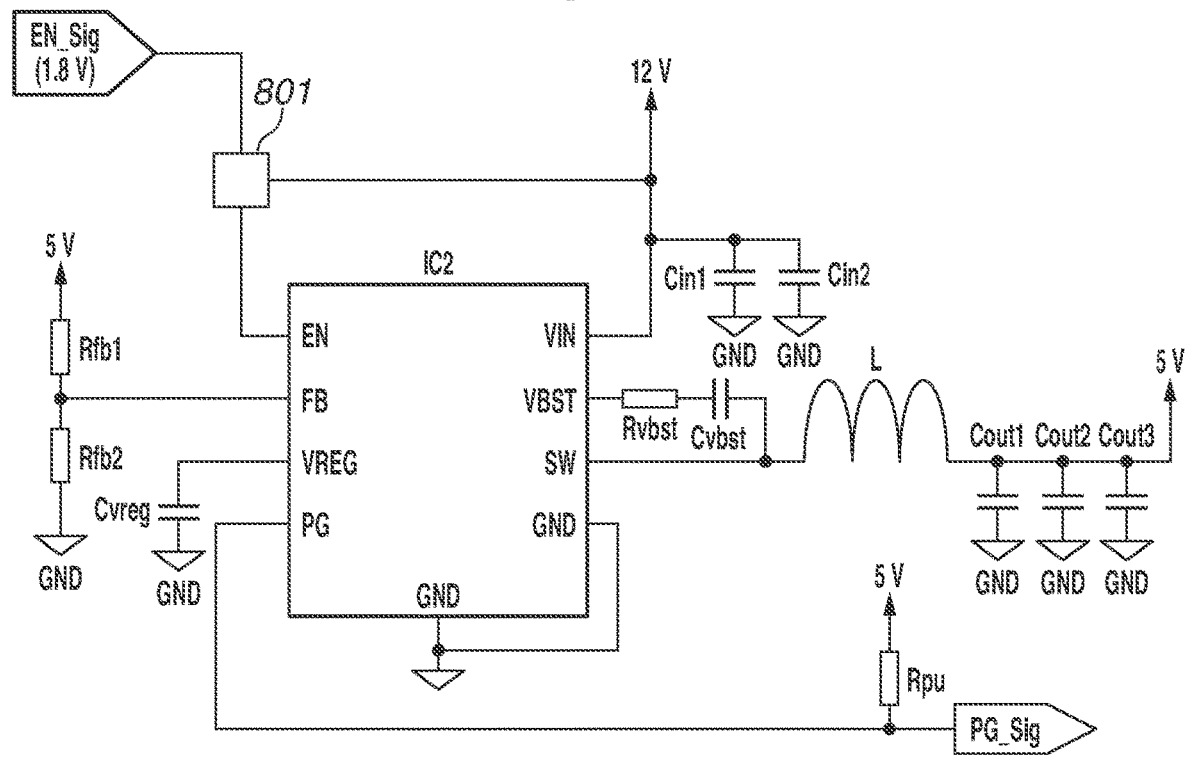

FIG. 4A is a circuit block diagram of the DC-DC converter in which an IC1 is mounted as an integrated circuit. FIG. 4B is a circuit block diagram of the DC-DC converter in which an IC2 is mounted as an integrated circuit. The IC1 and the IC2 are different in the input thresh of an EN terminal as indicated in Table 1. The IC1 and the IC2 are arranged such that the other terminals are common including surrounding board patterns.

EN Terminal Specification Comparison Table

TABLE 1

|     | VILmax[V] | VIHmin[V] |
| --- | --- | --- |
| IC1 | 0.6 | 1.6 |
| IC2 | 0.6 | 2.5 |

As indicated in FIGS. 4A and 4B, the integrated circuit (IC) mounted in the DC-DC converter has an input terminal (VIN terminal), an output terminal (SW terminal), a ground (GND) terminal, and a feedback terminal (FB). It is important that these terminals are common in arrangement and electric specifications. The VIN terminal and the SW terminal through which a large amount of current flows require a conductor pattern thicker than conductor patterns for other terminals. Further, capacitors are required near the VIN terminal and the SW terminal to reduce switching noise. Because the feedback terminal compares an input voltage with the reference voltage and turns on and off the SW terminal, the feedback terminal needs wiring (conductor pattern) that is not affected by noise in order to keep the output accuracy. Accordingly, these terminals are common in arrangement and electric specifications to unify the thickness of the conductor pattern and the arrangement of the surrounding parts (electric elements).

Besides the above-described terminals, the IC1 or the IC2 has a Bootstrap capacitor terminal (VBST terminal), a power source capacitor terminal (VREG terminal) that drives an internal logic unit, an EN terminal that performs output control, and a PG terminal for power good function. The power good function is a function of issuing a notification that a designated voltage is output. The IC1 or the IC2 may have a terminal for detecting an anomaly in an input voltage and a terminal for controlling a switching frequency. An 8-pin integrated circuit (the IC1 or the IC2) having a GND as a lower electrode is mounted on the circuit board having the function of the DC-DC converter illustrated in FIGS. 4A and 4B.

The EN terminal is also used for control to adjust the timing for making a power source sequence. Thus, it is necessary to input a plurality of power source voltages to a plurality of control targets. However, in a case where a plurality of types of DC-DC converters is mounted on the common board pattern, each IC needs to comply with the regulations for each EN terminal.

In this manner, it is possible to flexibly handle changes in the parts procurement situation by exclusively mounting an IC for the DC-DC converter (the IC1 or the IC2) that is identical in the number of pins, pin arrangement, terminal function and partially different in the characteristics of the pins on the common circuit board.

As shown in FIGS. 4A and 4B, the DC-DC converter has a power source voltage supplied to the VIN terminal. With reference to these circuit diagrams, a power source of 12 V is input. Noise reduction capacitors (Cin1 and Cin2) are arranged in the input power source. A capacitor Cvbst and a noise reduction resistor Rvbst are connected to the VBST terminal. An inductor L and output smoothing capacitors Cout1 to Cout3 are connected to the SW terminal to output an output voltage of 5 V. The output voltage is not limited to 5 V, and can be determined as appropriate in accordance with the used electronic part such as 3.3 V or 1.8 V. The constant of the inductor L is selected in accordance with the DC-DC converter in which the inductor is to be mounted. In order to implement the common board, it is necessary to select boards of an almost equal size capable of a shared pattern. The GND terminal and the GND of the lower electrode are connected directly to the GND. The output voltage is supplied to the FB terminal. As for the connection method, because the reference voltage for controlling turn-on and turn-off of the SW terminal is regulated, resistors Rfb1 and Rfb2 are connected to separate the voltage in accordance with the DC-DC converter. The resistance values of the resistors Rfb1 and Rfb2 are designed in accordance with the voltage to be output. A capacitor Cvreg is connected to the VREG terminal.

The PG terminal is an open drain output terminal. When being connected to a 5-V power source voltage via a resistor Rpu, the PG terminal sends a power-good signal to a control unit different from the IC1 or the IC2. The resistor Rpu is a pull-up resistor.

It is assumed that the CPU 203 (FIG. 3) inputs an enable signal (EN_Sig) of 1.8 V to the EN terminal. The enable signal (EN_Sig) is an example of an electric signal. In a case where the IC1 is mounted as illustrated in FIG. 4A, a pull-up resistor Ren1 is connected to the EN terminal. The IC1 in FIG. 4A has the 1.8-V enable signal (EN_Sig) input to the EN terminal via the pull-up resistor Ren1. As indicated in Table 1, in a case where the 1.8-V enable signal (EN_Sig) is input to the EN terminal of the IC1, the input voltage is equal to or higher than VIHmin, and thus an output voltage of 5 V is output from the SW terminal of the IC1.

On the other hand, in a case where the IC2 is mounted as illustrated in FIG. 4B, an electric element component called a voltage conversion unit 801 is connected to the EN terminal. In the IC2 in FIG. 4B, the voltage value of the 1.8-V enable signal is converted to 3.3 V by the voltage conversion unit 801, for example, and the signal is input to the EN terminal. As indicated in Table 1, because the input voltage of the EN terminal in the IC2 is not equal to or higher than VIHmin, an output voltage of 5 V cannot be output from the SW terminal of the IC2. This is because that the DC-DC converter illustrated in FIG. 4B has the voltage conversion unit 801 that adjusts the voltage value of the enable signal from the CPU 203 (FIG. 3) to a value equal to or greater than VIHmin in order to activate a predetermined function based on the enable signal from the CPU 203 (FIG. 3).

FIG. 5 is a circuit block diagram of the voltage conversion unit 801. When the 1.8-V enable signal (EN_Sig) becomes a high (1.8 V), an NPN transistor 901 turns on and the gate terminal of a P-channel field-effect transistor (FET) 902 having been pulled up by a resistor 903 changes to a low. Accordingly, when the P-channel FET 902 turns on, a voltage equal to or higher than VIHmin is input to the EN terminal of the IC2, so that the function of the IC2 to generate 5 V from 12 V is activated. A resistor 904 and a resistor 905 are used to adjust the voltage within a range in which the voltage can be input to the EN terminal of the IC2. This circuit block diagram illustrates a mere example of a circuit configuration for implementing the voltage conversion unit 801, and the voltage conversion unit 801 is not limited to the configuration described above.

Figure 6A:
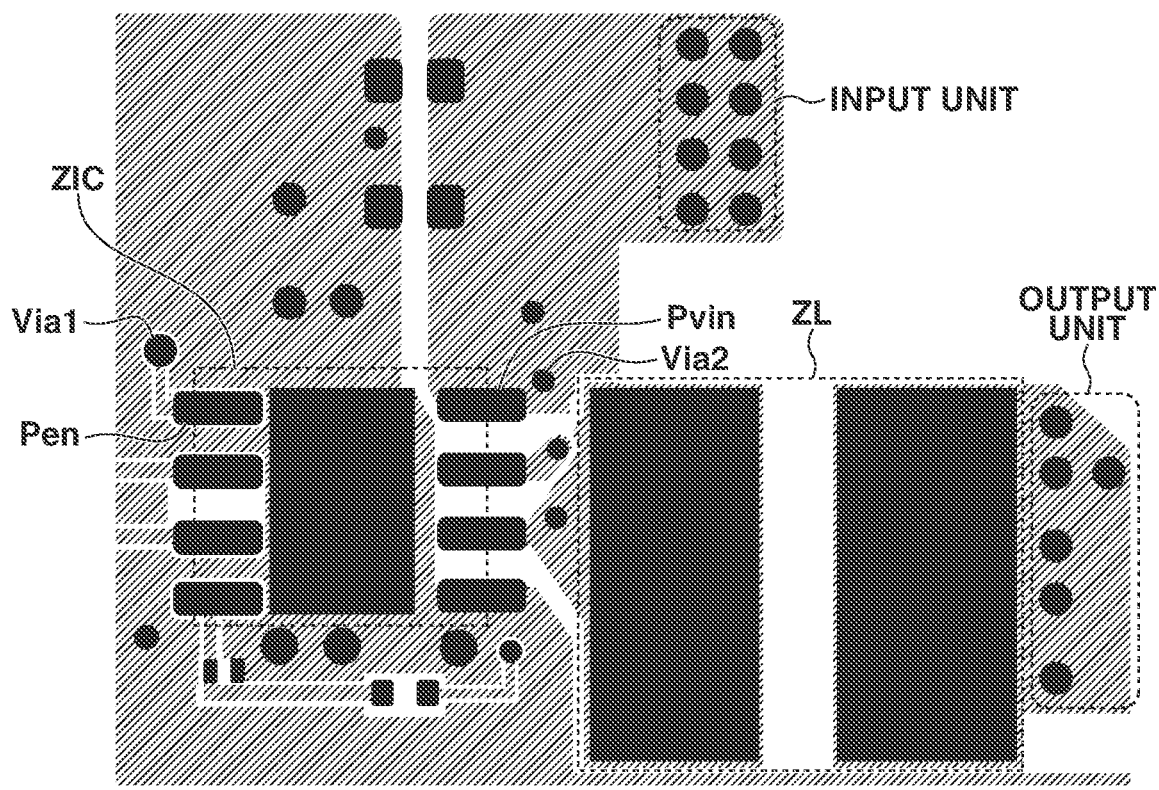
FIGS. 6A and 6B are schematic views of a circuit board in the DC-DC converter.
Figure 6B:
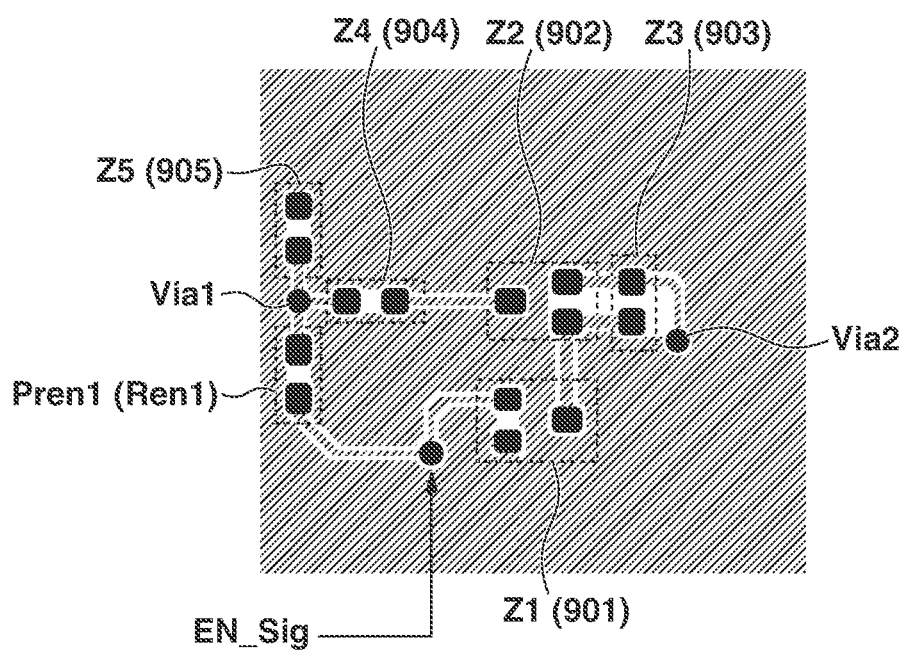

FIGS. 6A and 6B are schematic views of main parts of a circuit board on which the IC1 and the resistor Ren1 or the IC2 and an electric element component included in the voltage conversion unit 801 are exclusively mountable. The circuit board illustrated in FIGS. 6A and 6B will be described as a double-sided board.

FIG. 6A is a schematic view of main parts on a mount surface (first surface) of the circuit board. The mount surface (first surface) of the circuit board has an attachment part ZIC where the integrated circuit (the IC1 or the IC2) is exclusively mounted, and an attachment part ZL where the inductor L as a common electric element is mounted. The mount surface has an input part to which a power source voltage of 12 V is input and an output part from which an output voltage of 5 V is output.

The plurality of terminals of the integrated circuit attached to the attachment part ZIC is connected to pads that are conductor parts formed on the mount surface. The pads for terminals of the integrated circuit include a pad Pvin that is a conductor part to which the VIN terminal is connected and a pad Pen that is a conductor part to which the EN terminal is connected.

FIG. 6B is a schematic view of main parts on a solder surface (second surface) of the circuit board. The solder surface (second surface) of the circuit board has an input part to which an enable signal (EN_Sig) is input and an attachment part Pren1 where the resistor Ren1 is mounted. The solder surface (second surface) of the circuit board further has an attachment part Z1 where the NPN transistor 901 is mounted, an attachment part Z2 where the P-channel FET 902 is mounted, and attachment parts Z3, Z4, and Z5 where the resistors 903, 904, and 905 are mounted.

The circuit board has a plurality of vias that provides electric continuity between the mount surface and the solder surface. The pad Pen for the EN terminal is electrically connected to a via Via1 through a conductor pattern. The via Via1 on the solder surface is electrically connected, through a conductor pattern extending in three directions, to one of the pads to which the resistor Ren1 is connected, one of the pads to which the resistor 904 is connected, and one of the pads to which the resistor 905 is connected.

As illustrated in FIG. 6B, the solder surface is electrically connected to the other of the pads to which the resistor 904 is connected and one of the three pads for the P-channel FET 902 through a conductor pattern. The other two of the three pads for the P-channel FET 902, and the two pads to which the resistor 903 is connected are electrically connected through their respective conductor patterns. One of the two pads to which the resistor 903 is connected is electrically connected to a via Via2 through a conductive pattern, and is electrically connected to the VIN terminal on the mount surface.

One of the three pads for the NPN transistor 901 is electrically connected to one of the three pads for the P-channel FET 902. The input part of the enable signal (EN_Sig) is electrically connected to one of the other two pads for the NPN transistor 901 and the other of the pads to which the resistor Ren1 is connected through their respective conductor patterns. Thus, the conductor pattern electrically continuous to the input part of the enable signal (EN_Sig) has one end connected to the pad for the NPN transistor 901 and the other end connected to the pad for the resistor Ren1.

In a case where the IC1 is mounted on the circuit board, the resistor Ren1 is mounted but the NPN transistor 901, the P-channel FET 902, and the resistors 903, 904, and 905 are not mounted on the solder surface illustrated in FIG. 6B. On the other hand, in a case where the IC2 is mounted on the circuit board, the NPN transistor 901, the P-channel FET 902, the resistors 903, 904, and 905 are mounted but the resistor Ren1 is not mounted on the solder surface.

In a case where the resistor Ren1 is not mounted, the attachment part Pren1 on the solder surface is opened such that the conductor patterns electrically connected to the pads do not become electrically continuous. Similarly, in a case where the resistor 904 is not mounted, the attachment part Z4 on the solder surface is opened such that the conductor patterns electrically connected to the pads do not become electrically continuous. Similarly for the other electric elements, the pads are opened in a case where the electric elements are not mounted.

As described above, in the circuit board of the present exemplary embodiment, electric elements to be mounted can be changed in accordance with the characteristics of the DC-DC converter. This makes it easy to replace the IC1 with the alternative IC2 (or replace the IC2 with the alternative IC1). Further, the circuit board of the present exemplary embodiment is configured such that an electric element component is exclusively mounted on the solder surface that is different from the mount surface on which the integrated circuit is mounted. This realizes space saving of the circuit board.

As a circuit board of a second exemplary embodiment, a circuit board of an input-side switch (hereinafter, called high-side SW) will be described. Integrated circuits identical in the number of terminal pins, terminal pin arrangement, and functions and different in output characteristics of an overcurrent terminal are exclusively mountable on the circuit board. The high-side SW is provided in a universal serial bus (USB) interface to control power supply to an option device connected to an USB, for example. The option device is an expanded memory or a card reader, for example.

Figure 7A:
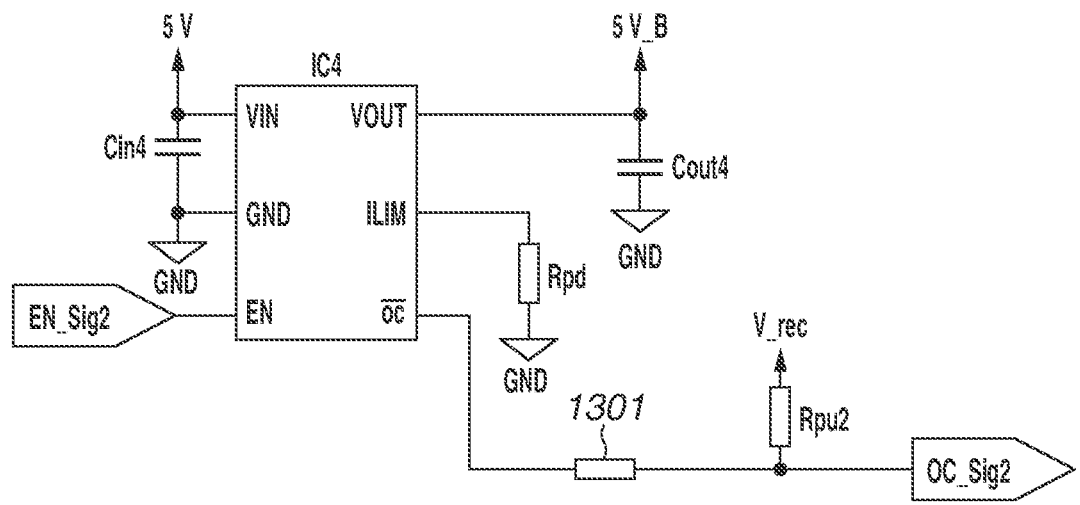
FIGS. 7A and 7B are circuit block diagrams of a high-side switch in which an integrated circuit is mounted.
Figure 7B:
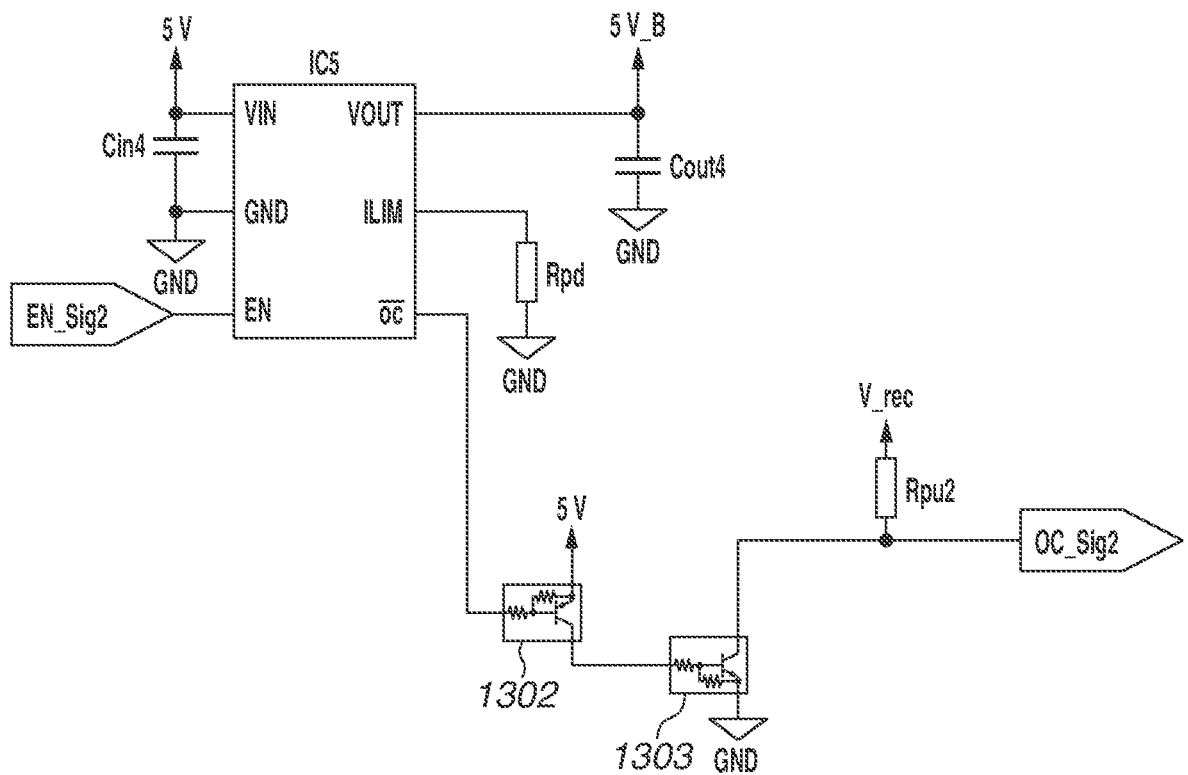

FIG. 7A is a circuit block diagram of the high-side SW where an IC4 is mounted as an integrated circuit. FIG. 7B is a circuit block diagram of the high-side SW where an IC5 is mounted as an integrated circuit. The IC4 (or the IC5) mounted in the high-side SW includes an input terminal (VIN), an output terminal (VOUT), and a GND terminal as main terminals. It is important that the positions of these terminals are common. This is because, unlike in other controls, the VIN terminal and the VOUT terminal through which a large amount of current flows need to have a thick pattern.

The integrated circuit IC4 (or IC5) further includes a resistor terminal for current limitation (ILIM terminal), an EN terminal that performs output control, and an overcurrent terminal (OC terminal) that makes an error notification in a case where a current limiter is activated. In this description, a 6-pin IC4 (or IC5) is used as an integrated circuit mounted in the high-side SW.

A power source of 5 V is input to the VIN terminal. The VIN terminal is electrically connected to a noise-reduction capacitor (Cin4). An output capacitor cout4 is electrically connected to the VOUT terminal. A voltage of 5 V output from the VOUT terminal (hereinafter, described as 5V_B for separated description) is supplied to the IC of the option device connected to the USB interface. The high-side SW of the present embodiment is an example, and the input/output voltage may be 3.3 V or 1.8 V, and may be designed as appropriate in accordance with an electric element to which the voltage output from the VOUT terminal is supplied.

The GND terminal is directly connected to a GND. In a case where the EN terminal needs timing control of power source, a power source control signal is input to the EN terminal. In a case where an output voltage is output in a free-running manner in accordance with the input power source, pullup (PU) connection may be made through a resistor to the power source voltage. The ILIM terminal is connected to the GND through a resistor RILIM. Because the resistance value of the current limitation varies depending on the high-side SW, the resistor may be selected in accordance with the current value to be set.

The integrated circuit mounted in the high-side SW has an overcurrent protective function. An open current signal (OC_sig2) from the OC terminal indicates a high level in a case where the current flowing in the ILIM terminal is smaller than a threshold, and indicates a low level in a case where the current flowing in the ILIM terminal is equal to or higher than the threshold. The open current signal (OC_sig2) is an example of an electric signal. In a case where the IC4 is mounted, a short resistor 1301 is mounted.

The open current signal (OC_sig2) is input to the CPU 203 (FIG. 3) that functions as a signal processing unit, for example. When the opening current signal (OC_sig2) changes from the high level (first state) to the low level (second state), the CPU 203 (FIG. 3) stops power supply to the option device connected to the subsequent stage in the high-side SW. Accordingly, even if the IC of the option device causes a short-circuit and overcurrent flows, the power supply to the option device is stopped to reduce the influence on the other device.

The OC terminal of the IC4 performs an open drain output and is electrically connected to a power source voltage V_rec that is supplied by the resistor Rpu2 to the option device in the subsequent stage, and outputs the open current signal (OC_sig2). On the other hand, there is also an integrated circuit (IC5) that pulls up the OC terminal using the power source voltage (5 V) of the IC of the high-side SW, instead of pulling up the OC terminal by the power source voltage applied to the option device in the subsequent stage like an open drain output.

Figure 8A:
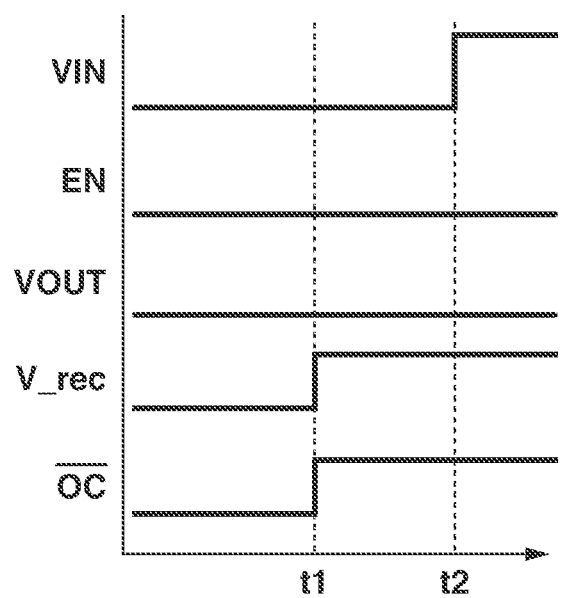
FIGS. 8A and 8B are timing charts illustrating signals from terminals of the integrated circuit.
Figure 8B:
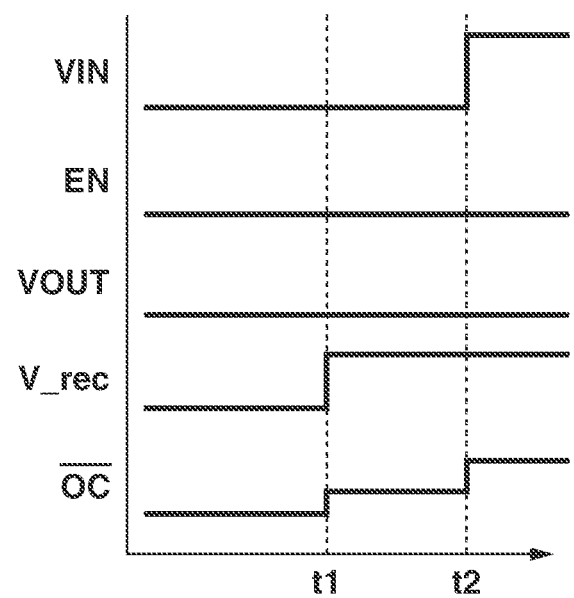

FIG. 8A is a timing chart that indicates signals from the individual terminals of the IC4. As illustrated in FIG. 8A, in a case where the power source voltage V_rec is input at timing t1, the voltage of the OC terminal of the IC4 rises to the same value as that of the power source voltage V_rec. On the other hand, FIG. 8B is a timing chart that indicates signals from the individual terminals of the IC5. As illustrated in FIG. 8B, the voltage of the OC terminal of the IC5 is at the intermediate potential from the timing t1 with which the power source voltage V_rec was input to timing t2 with which 5 V is input to the VIN terminal. This is because the IC5 pulls up the OC terminal using the power source voltage (5 V) of the IC of the high-side SW. In a case where the overcurrent signal (OC_Sig2) is at the intermediate potential, the power supply to the IC of the option device in the subsequent stage may be stopped or the overcurrent protective function may not be appropriately performed.

In a case where the IC5 is mounted, a resistor-contained PNP transistor 1302 and a resistor-contained NPN transistor 1303 are mounted to adjust the overcurrent signal (OC_Sig2) to a predetermined voltage value. The power source voltage (5 V) of the IC5 is supplied to the resistor-contained PNP transistor 1302. Accordingly, in the high-side SW with the IC5, the output of the OC terminal of the IC5 is pulled up with the power source voltage (5 V) of the IC5, and the resistor-contained NPN transistor 1303 performs an open drain output. Thus, the normal overcurrent signal (OC_sig2) can be input to the CPU 203 (FIG. 3). In a case where the IC5 is mounted, the short resistor 1301 is not mounted. On the other hand, in a case where the IC4 is mounted, the resistor-contained PNP transistor 1302 and the resistor-contained NPN transistor 1303 are not mounted.

Figure 9:
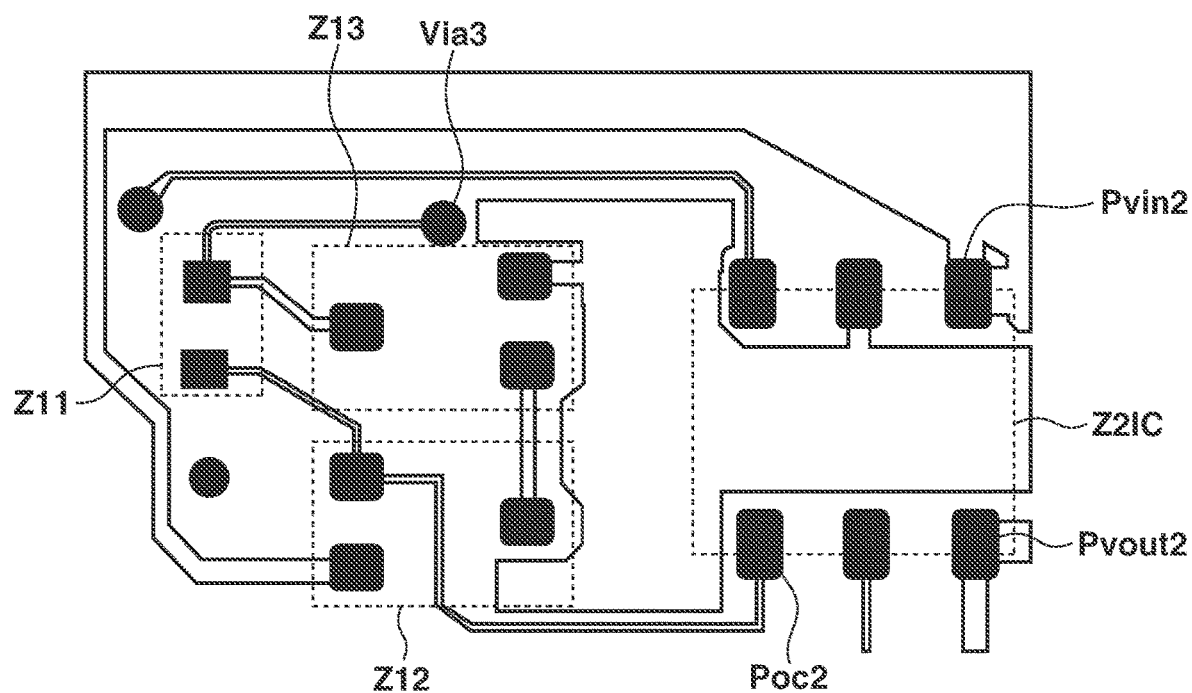
FIG. 9 is a schematic view of a circuit board in the high-side switch.

FIG. 9 is a schematic view of main parts of a circuit substrate on which the IC4 and the short resistor 1301 or the IC5, the resistor-contained PNP transistor 1302, and the resistor-contained NPN transistor 1303 are exclusively mountable. FIG. 9 illustrates only one surface of the circuit board. However, the circuit board of the present embodiment may be any of a single-sided board, a double-sided board, or a multi-layered board.

The mount surface of the circuit board has an attachment part Z2IC where the integrated circuit (IC4 or IC5) is exclusively mounted, an attachment part Z11 where a short resistor 1301 is mounted, and a plurality of vias. The mount surface further has an attachment part Z12 where the resistor-contained PNP transistor 1302 is mounted, and an attachment part Z13 where the resistor-contained NPN transistor 1303 is mounted.

The plurality of terminals of the integrated circuit attached to the attachment part Z21C is connected to pads that are conductor parts formed on the mount surface. The pads for the terminals of the integrated circuit include a pad Pvin2 that is a conductor part to which the VIN terminal is connected, a pad Pvout2 that is a conductor part to which the VOUT terminal is connected, and a pad Poc2 that is a conductor part to which the OC terminal is connected.

The attachment part Z11 where the short resistor 1301 is mounted has two pads that are conductor parts to which the terminals of the short resistor 1301 are connected. The attachment part Z12 where the resistor-contained PNP transistor 1302 is mounted has three pads that are conductor parts to which the terminals of the resistor-contained PNP transistor 1302 are connected. Similarly, the attachment part Z13 where the resistor-contained NPN transistor 1303 is mounted has three pads that are conductor parts to which the terminals of the resistor-contained NPN transistor 1303 are connected.

As shown in FIG. 9, the pad Poc2 for the OC terminal and one of the pads for the terminals of the resistor-contained PNP transistor 1302 are electrically connected via a conductor pattern. The conductor pattern extends to one of the pads for the short resistor 1301. Accordingly, the pad Poc2 for the OC terminal and one of the pads for the short resistor 1301 are also electrically connected. In a case where the short resistor 1301 is not mounted, the two pads for the short resistor 1301 are opened so as not to be electrically continuous.

The other of the pads for the terminals of the resistor-contained PNP transistor 1302 and one of the pads for the terminals of the resistor-contained NPN transistor 1303 are electrically connected via a conductor pattern. The other of the pads for the terminals of the resistor-contained NPN transistor 1303 and the other of the pads for the short resistor 1301 are electrically connected via a conductor pattern. In a case where the resistor-contained PNP transistor 1302 is not mounted, the three pads for the resistor-contained PNP transistor 1302 are opened so as not to be electrically continuous. Similarly, in a case where the resistor-contained NPN transistor 1303 is not mounted, the three pads for the resistor-contained NPN transistor 1303 are opened so as not to be electrically continuous.

The other of the pads for the short resistor 1301 is connected to the CPU 203 (FIG. 3) via a conductor pattern. The circuit board has a via Via3 for inputting the overcurrent signal (OC_Sig2) to the CPU 203 (FIG. 3). The overcurrent signal (OC_Sig2) output through the via Via3 is input to the CPU 203 (FIG. 3) via a conductor pattern not illustrated. The via Via3 functions as an output conductor part that outputs the overcurrent signal (OC_Sig2). The conductor pattern for electrically connecting the via Via3 and the other of the pads for the short resistor 1301 will be called an output conductor pattern.

In a case where the IC4 is mounted on the circuit board illustrated in FIG. 9, the short resistor 1301 is mounted and the resistor-contained PNP transistor 1302 and the resistor-contained NPN transistor 1303 are not mounted. On the other hand, in a case where the IC5 is mounted on the circuit board, the resistor-contained PNP transistor 1302 and the resistor-contained NPN transistor 1303 are mounted and the short resistor 1301 is not mounted.

As described above, in the circuit board of the present exemplary embodiment, electric elements to be mounted can be changed in accordance with the characteristics of the high-side SW. This makes it easy to replace the IC4 with the alternative IC5 (or replace the IC5 with the alternative IC4). In the circuit board of the present exemplary embodiment, the integrated circuit is mounted on the common attachment part Z2IC, which eliminates the need to provide individual attachment parts for mounting the integrated circuit. This achieves saving a space for the circuit board.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-139633, filed Sep. 2, 2022, which is hereby incorporated by reference herein in its entirety.

What is claimed is:

1. A circuit board on which a first set or a second set is exclusively mounted, wherein the first set includes at least a first integrated circuit and a first electric element, and the second set including at least a second integrated circuit and a second electric element, the circuit board comprising:
   an integrated circuit (IC) attachment part to which the first integrated circuit or the second integrated circuit is attached;
   a first attachment part to which the first electric element is attachable and that includes at least a first pad and a second pad;
   a second attachment part to which the second electric element is attachable and that includes at least a third pad and a fourth pad;
   a first conductor pattern configured to electrically connect the IC attachment part and the first pad of the first attachment part;
   a second conductor pattern configured to electrically connect the IC attachment part and the third pad of the second attachment part; and
   a third conductor pattern configured to electrically connect the second pad of the first attachment part and the fourth pad of the second attachment part,
   wherein, in a case where the first electric element is not mounted, the first pad and the second pad of the first attachment part are opened so as not to be electrically conductive with each other, and
   wherein, in a case where the second electric element is not mounted, the third pad of the second attachment part and the second pad are opened so as not to be electrically conductive with each other.

2. The circuit board according to claim 1,
   wherein the IC attachment part is formed on a first surface of the circuit board, and
   wherein the first attachment part and the second attachment part are formed on a second surface opposite to the first surface of the circuit board.

3. The circuit board according to claim 1, wherein the IC attachment part, the first attachment part, and the second attachment part are formed on a mount surface of the circuit board.

4. The circuit board according to claim 1, wherein an input part to which an electric signal is input is formed between one end of the third conductor pattern and another end of the third conductor pattern.

5. The circuit board according to claim 4, wherein the electric signal is an enable signal for switching between an activation and an inactivation of a predetermined function.

6. The circuit board according to claim 1,
   wherein an enable signal for switching between an activation and an inactivation of a predetermined function is input to the first integrated circuit or the second integrated circuit,
   wherein, in a case where the first integrated circuit is mounted, a voltage of the enable signal is compared to a first threshold voltage, and
   wherein, in a case where the second integrated circuit is mounted, the voltage of the enable signal is compared to a second threshold voltage that is different from the first threshold voltage.

7. A circuit board on which a first set or a second set is exclusively mounted, wherein the first set includes at least a first integrated circuit and a first electric element, and the second set including at least a second integrated circuit and a second electric element, the circuit board comprising:
   an integrated circuit (IC) attachment part to which the first integrated circuit or the second integrated circuit is attached;
   a first attachment part to which the first electric element is attachable and that includes at least a first pad and a second pad;
   a second attachment part to which the second electric element is attachable and that includes at least a third pad and a fourth pad;
   a first conductor pattern configured to electrically connect the IC attachment part, the first pad of the first attachment part, and the third pad of the second attachment part; and
   a second conductor pattern configured to electrically connect the second pad of the first attachment part and the fourth pad of the second attachment part,
   wherein, in a case where the first electric element is not mounted, the first pad and the second pad of the first attachment part are opened so as not to be electrically conductive with each other, and
   wherein, in a case where the second electric element is not mounted, the third pad of the second attachment part and the second pad are opened so as not to be electrically conductive with each other.

8. The circuit board according to claim 7, further comprising:
   an output unit configured to output an electric signal output from the IC attachment part to another signal processing unit; and
   a third conductor pattern configured to electrically connect the output unit, the second pad of the first attachment part, and the fourth pad of the second attachment part.

9. The circuit board according to claim 8, wherein the electric signal is an overcurrent signal configured to change from a first state to a second state on detecting an overcurrent.

10. The circuit board according to claim 7,
    wherein, in a case where the first integrated circuit is mounted, a value of a voltage of an overcurrent signal output from the IC attachment part when no overcurrent is detected is a first voltage value, and wherein, in a case where the second integrated circuit is mounted, the value of the voltage of the overcurrent signal output from the IC attachment part when no overcurrent is detected is a second voltage value that is different from the first voltage value.

* * * * *